US012635368B2

(12) United States Patent
Yang

(10) Patent No.: US 12,635,368 B2
(45) Date of Patent: May 19, 2026

(54) DISPLAY PANEL AND DISPLAY DEVICE

(71) Applicant: Wuhan Tianma Micro-Electronics Co., Ltd., Wuhan (CN)

(72) Inventor: Yuehua Yang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 353 days.

(21) Appl. No.: 18/241,608

(22) Filed: Sep. 1, 2023

(65) Prior Publication Data

US 2024/0414962 A1      Dec. 12, 2024

(30) Foreign Application Priority Data

Jun. 8, 2023    (CN) ......................... 202310679624.X

(51) Int. Cl.
H10K 59/131        (2023.01)
H10K 59/121        (2023.01)
(52) U.S. Cl.
CPC ....... H10K 59/131 (2023.02); H10K 59/1216 (2023.02)
(58) Field of Classification Search
CPC .. H10K 59/131; H10K 59/1216; H10H 29/39; H10H 29/49; H10H 20/857; H10H 29/142; H01L 27/3276; H01L 27/326; H01L 27/3262; H01L 27/3265
See application file for complete search history.

(56) References Cited

U.S. PATENT DOCUMENTS

| | | | |
|---|---|---|---|
| 9,773,858 B2 * | 9/2017 | Cho ....................... | H10K 59/88 |
| 11,910,678 B1 * | 2/2024 | Zhang ................. | G09G 3/3233 |
| 12,014,665 B1 * | 6/2024 | Zhang ................. | G09G 3/2003 |
| 12,361,854 B2 * | 7/2025 | Zhang ................. | G09G 3/3208 |
| 2021/0118958 A1 * | 4/2021 | Park ...................... | H10K 59/131 |
| 2021/0234079 A1 * | 7/2021 | Han .......................... | G09F 9/30 |
| 2021/0265450 A1 * | 8/2021 | Oh ..................... | H10K 59/1216 |
| 2022/0310744 A1 * | 9/2022 | Bai ........................ | H10K 85/00 |
| 2023/0180557 A1 * | 6/2023 | Zou ........................ | H10D 86/60 |
| | | | 257/72 |
| 2024/0363048 A1 * | 10/2024 | Zhang ................. | G09G 3/2003 |

FOREIGN PATENT DOCUMENTS

| | | | | | |
|---|---|---|---|---|---|
| CN | 113161401 A | * | 7/2021 | ............ | G09F 9/301 |
| CN | 114784077 A | * | 7/2022 | ......... | H10K 59/1315 |
| CN | 115064108 A | * | 9/2022 | .............. | G09G 3/20 |

* cited by examiner

*Primary Examiner* — Earl N Taylor

(74) *Attorney, Agent, or Firm* — Anova Law Group, PLLC

(57)        ABSTRACT

A display panel and a display device are provided. The display panel includes a display area including a first display area and a second display area and a first fan-out area including a plurality of fan-out lines including a plurality of first fan-out lines and a plurality of second fan-out lines, a plurality of data lines extending in the second direction and arranged in the first direction, a plurality of connection wirings and a power signal line. The first data line is connected to the first fan-out line through the connection wiring, and the second data line is connected to the second fan-out line; and along a direction perpendicular to a plane where the display panel is located, the first fan-out line overlaps with the power signal line, and a line segment overlapping with the power signal lines in each first fan-out line is located on a same layer.

20 Claims, 12 Drawing Sheets

B-B

DISPLAY PANEL AND DISPLAY DEVICE

CROSS-REFERENCE TO RELATED APPLICATION

This application claims the priority of Chinese Patent Application No. 202310679624.X, filed on Jun. 8, 2023, the content of which is incorporated by reference in its entirety.

TECHNICAL FIELD

The present disclosure generally relates to the field of display technologies and, more particularly, relates to a display panel and a display device.

BACKGROUND

From the era of cathode ray rube (CRT) display to the era of liquid crystal display (LCD), and now to the era of organic light-emitting diode (OLED) display and the era of light-emitting diode display, the display industry has experienced decades of development and has become ever-changing. The display industry has been developed from traditional mobile phones, tablets, TVs and PCs, to current smart wearable devices, and VR, car displays and other electronic devices are inseparable from the display technologies.

With the development of the display technologies, users have higher and higher requirements for display products, how to reduce the signal coupling problem in the display panel has become one of the technical problems to-be-solved urgently at this stage. The present disclosed display panel and display devices are direct to solve one or more problems set forth above and other problems in the arts.

SUMMARY

One aspect of the present disclosure provides a display panel. The display panel includes a display area including a first display area and a second display area and the first display area is located at least one side of the second display area in a first direction. The display panel also includes a first fan-out area located at one side of the display area in a second direction, and the first fan-out area includes a plurality of fan-out lines, and the plurality of fan-out lines include a plurality of first fan-out lines and a plurality of second fan-out lines, and the first direction intersects the second direction. Further, the display panel includes a plurality of data lines extending in the second direction and arranged in the first direction, and the plurality of data lines include a plurality of first data lines located in the first display area and a plurality of second data lines in the second display area; Further, the display panel also includes a plurality of connection wirings, and at least a portion of line segments of the plurality of connection wirings are located in the second display area, a first data line is connected to a first fan-out line through a connection wiring, and a second data line is connected to a second fan-out line. Further, the display panel also includes a power signal line. At least a portion of a line segment of the power signal line is located in the first fan-out area, along a direction perpendicular to a plane where the display panel is located, the first fan-out line overlaps with the power signal line, and a line segment overlapping with the power signal lines in each of the plurality first fan-out lines is located on a same layer.

Another aspect of the present disclosure provides a display device. The display device includes a display panel.

The display panel includes a display area including a first display area and a second display area and the first display area is located at least one side of the second display area in a first direction. The display panel also includes a first fan-out area located at one side of the display area in a second direction, and the first fan-out area includes a plurality of fan-out lines, and the plurality of fan-out lines include a plurality of first fan-out lines and a plurality of second fan-out lines, and the first direction intersects the second direction. Further, the display panel includes a plurality of data lines extending in the second direction and arranged in the first direction, and the plurality of data lines include a plurality of first data lines located in the first display area and a plurality of second data lines in the second display area; Further, the display panel also includes a plurality of connection wirings, and at least a portion of line segments of the plurality of connection wirings are located in the second display area, a first data line is connected to a first fan-out line through a connection wiring, and a second data line is connected to a second fan-out line. Further, the display panel also includes a power signal line. At least a portion of a line segment of the power signal line is located in the first fan-out area, along a direction perpendicular to a plane where the display panel is located, the first fan-out line overlaps with the power signal line, and a line segment overlapping with the power signal lines in each of the plurality first fan-out lines is located on a same layer.

Other aspects of the present disclosure can be understood by those skilled in the art in light of the description, the claims, and the drawings of the present disclosure.

BRIEF DESCRIPTION OF THE DRAWINGS

To illustrate the technical solutions in the embodiments of the present disclosure more clearly, the following briefly introduces the accompanying drawings used in the description of the embodiments. Obviously, the accompanying drawings in the following description are only some embodiments of the present disclosure, for those of ordinary skill in the art, other drawings can also be obtained from these drawings without creative effort.

FIG. 10 illustrates another exemplary CC-sectional view of the display panel in

FIG. 1;

DETAILED DESCRIPTION

Various exemplary embodiments of the present disclosure will now be described in detail with reference to the accompanying drawings. It should be noted that the relative arrangements of components and steps, numerical expressions and numerical values set forth in these embodiments do not limit the scope of the present disclosure unless specifically stated otherwise.

The following description of at least one exemplary embodiment is merely illustrative in nature and in no way taken as limiting the disclosure, its application or uses.

Techniques, methods and devices known to those of ordinary skill in the relevant art may not be discussed in detail, but where appropriate, such techniques, methods and devices should be considered part of the description.

In all examples shown and discussed herein, any specific values should be construed as exemplary only, and not as limitations. Therefore, other instances of the exemplary embodiment may have different values.

It will be apparent to those skilled in the art that various modifications and variations can be made in the present disclosure without departing from the spirit or scope of the disclosure. Therefore, the present disclosure is intended to cover the modifications and variations of the present disclosure falling within the scope of the corresponding claims (technical solutions to be protected) and their equivalents. It should be noted that, the implementation manners provided in the embodiment of the present disclosure may be combined with each other if there is no contradiction.

It should be noted that like numerals and letters denote like items in the following figures, therefore, once an item is defined in one figure, it does not require further discussion in subsequent figures.

Figure 1:
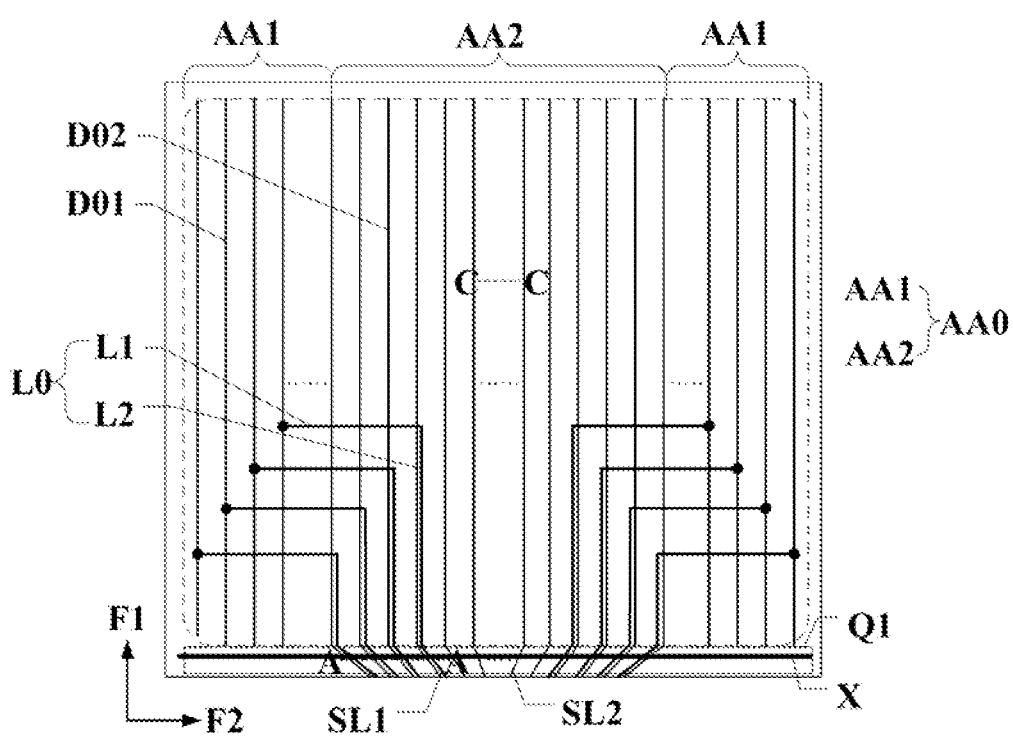
FIG. 1 illustrates a top view of an exemplary display panel according to various disclosed embodiments of the present disclosure.
Figure 2:
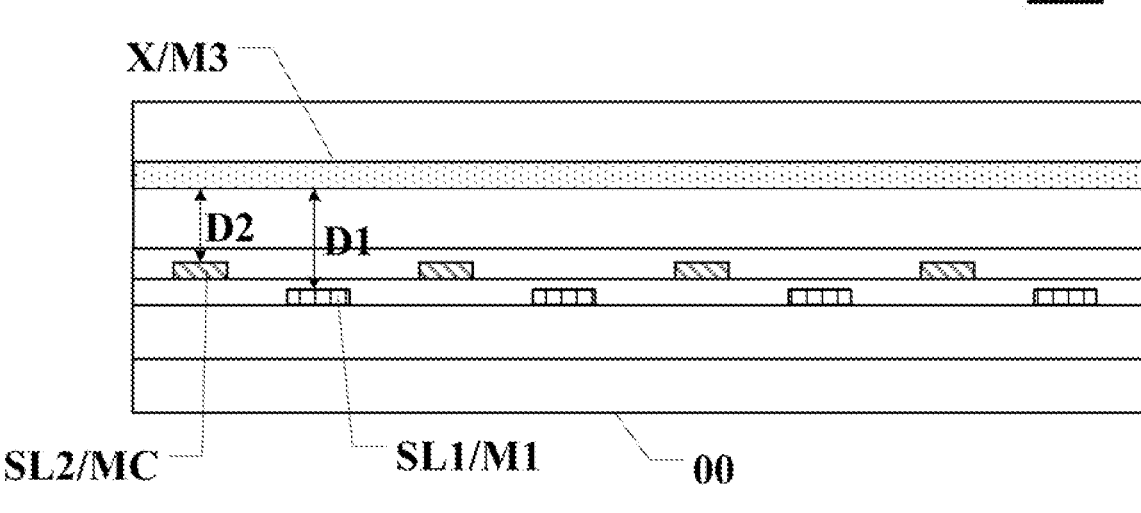
FIG. 2 illustrates an AA-sectional view of the display panel in FIG. 1.

FIG. 1 shows a top view of an exemplary display panel provided by the embodiments of the present disclosure, and FIG. 2 shows an exemplary AA-sectional view of the display panel in FIG. 1. As shown in FIG. 1 and FIG. 2, a display panel provided by one embodiment of the present disclosure may include a display area AA0. The display area AA0 may include a first display area AA1 and a second display area AA2. In a first direction F1, the first display area AA1 may be located at least one side of the second display area AA2.

In one embodiment, the second display area AA2 may be located in the middle area of the display panel, and the first display area AA1 may be located at one side or both sides of the display panel in the first direction F1. FIG. 1 takes the first display area AA1 provided at both sides of the second display area AA2 as an example for illustration.

The display panel may further include a first fan-out area Q1 located at one side of the display area AA0 in the second direction F2. The first fan-out area Q1 may include a plurality of fan-out lines. The plurality of fan-out lines may include a plurality of first fan-out lines SL1 and a plurality of second fan-out lines SL2. The first direction F1 may intersect with the second direction F2. It should be noted that FIG. 1 only schematically shows some fan-out lines in the display panel, and does not limit the number of fan-out lines actually included in the display panel.

The display area AA0 may also include a plurality of data lines extending in the second direction F2 and arranged in the first direction F1. The plurality of data lines may also include a plurality of first data lines D01 located in the first display area AA1 and a plurality of second data lines D02 located in the second display area AA2. FIG. 1 only schematically illustrates some of the data lines included in the display panel, and does not limit the number of data lines actually included on the display panel. FIG. 1 illustrates an example where the first data lines D01 are located at both sides of the second data line D02 in the first direction F1.

The display area AA0 may also include a plurality of connection wirings L0. At least a portion of the line segments of the connection wirings L0 may be located in the second display area AA2. The first data line D01 may be connected to the first fan-out lines SL1 through the connection wiring L0, and the second data line D02 may be connected to the second fan-out line SL2. In embodiment, the connection wiring L0 may include first connection wiring L1 and second connecting wiring L2 electrically connected. The first connection wiring L1 may extend along the first direction F1, and may be connected to the first data line D01. The second connection line L2 may extend along the second direction F2, and may be located between two adjacent second data lines D02 in the second display area AA2. The first data line D01 may be connected to the first fan-out line SL1 through the first connection wiring L1 and the second connection wiring L2. Accordingly, the first data line D01 may obtain a signal through the second connection wiring L2 located in the second display area AA2. The second data line D02 may directly extend to the first fan-out area Q1 and may be electrically connected to the second fan-out line SL2. It should be noted that the extension of the first connection wiring L1 along the first direction F1 may mean that the overall extending trend of the first connection wiring L1 is in the first direction F1, and it does not limit that the first connection wiring L1 must be a straight line. Similarly, the extension of the second connection wiring L2 in the second direction F2 may means that the overall extending trend of the second connection wiring L2 is in second direction F2, and it does not limit that the second connection wiring L2 must be a straight line.

Further, referring to FIG. 1 and FIG. 2, the display panel may further include a power signal line X, and at least a portion of the line segment of the power signal line X may be located in the first fan-out area Q1. In a direction perpendicular to the plane where the display panel is located, the first fan-out line SL1 may overlap with the power signal line X, and the line segments overlapping the power signal line X in each of the first fan-out lines SL1 may be located in the same layer.

Further, referring to FIG. 1 and FIG. 2, in the display panel provided by the embodiment of the present disclosure, in the first direction F1, the first display area AA1 in the display area AA0 may be located at both sides of the second display area AA2, and the display panel may include a connection wiring L0 connected to the first data line D01. In one embodiment, the connection wiring L0 may include a first connection wiring L1 extending along the first direction F1 and a second connection wiring L2 extending along the second direction F2. Both ends of the first connection wiring L1 may be respectively connected to the first data line D01 and the second connection wiring L2, and the second connection wiring L2 may also be electrically connected to the first fan-out line SL1. In such a configuration, there may be no need to wire on the lower left frame and/or the lower right frame of the display panel to realize the electrical connection between the first data line D01 and the fan-out line, but the electrical connection between the first data line D01 and the first fan-out line SL1 may be realized by electrically connecting the second connection wiring L2 in the second display area AA2 to the fan-out line. Accordingly, a compressed space may be provided for the lower left frame and/or lower right frame of the display panel, thus facilitating the realization of a narrow frame design of the product.

A power signal line X may also be arranged in the first fan-out region Q1, and the first fan-out line SL1 connected to the first data line D01 may overlap with the power signal line X in a direction perpendicular to the plane where the display panel is located. In the related art, due to the large electrical signal on the power signal line X, if different first fan-out lines SL1 are arranged on different film layers, the vertical distances between the different first fan-out lines SL1 and the power signal line X will be different, resulting in a large difference in coupling capacitance, resulting in a large difference in the coupling capacitance between different first fan-out lines SL1, which may lead to a large difference in the coupling capacitance of the first data line D01 connected to different first fan-out lines SL1, and differences in the display brightness of sub-pixels connected to different first data lines D01, resulting in uneven display. Therefore, in the display panel provided by the embodiments of the present disclosure, in the first fan-out area Q1, the line segments overlapping the power signal line X in the first fan-out line SL1 may be arranged in the same layer such that the vertical distance between the line segments overlapping the power signal line X in the first fan-out line SL1 and the power signal line X may be equal such that the coupling capacitance between each first fan-out line SL1 and the power signal line X may be same, and the coupling capacitance difference between the first data line D01 electrically connected to different first fan-out lines SL1 may be reduced. Therefore, it may be beneficial to solve the problem of uneven display caused by large differences in the coupling capacitances of different first data lines, and it may be beneficial to improve the overall display effect of the display panel.

Figure 3:
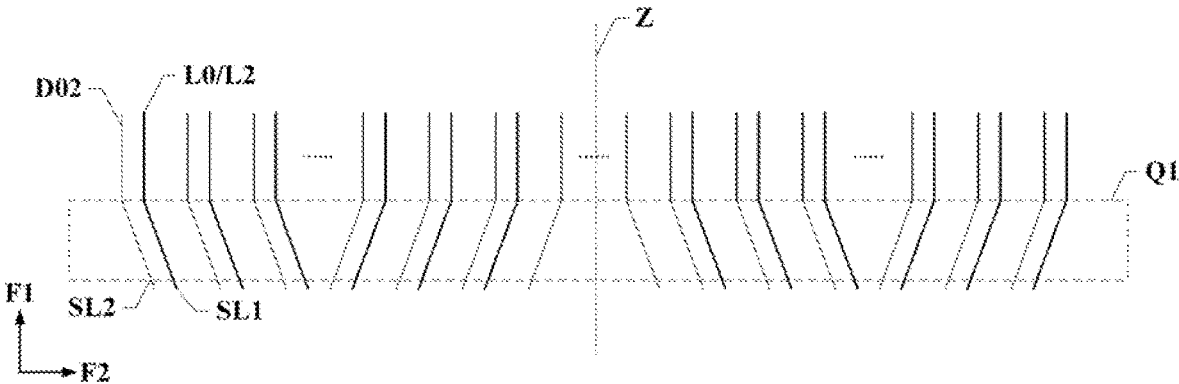
FIG. 3 illustrates an exemplary layout of a first fan out area and a first adjacent partial display panel.

FIG. 3 is a schematic diagram of an exemplary wiring of the first fan-out area Q1 and a portion of the display area adjacent to the first fan-out area Q1. As shown in FIG. 3, in one embodiment, in the first fan-out area Q1, the fan-out lines may be symmetrically arranged, and the axis of symmetry Z may extend in the first direction F1 and may be located in the middle of the first fan-out area Q1. It should be noted that, referring to FIG. 1 and FIG. 3, because the first fan-out area Q1 may be located directly below the second display area AA2, FIG. 3 only schematically illustrates the wiring in the second display area AA2 (including the second data line D02 and the connection wiring L0 connected to the first data line D01), and the first data line D01 in the first display area AA1 is not shown.

Further, referring to FIG. 3, if the first fan-out area Q1 is divided into left and right parts in the second direction F2 by the axis of symmetry Z, the fan-out lines in the first fan-out area Q1 may be arranged symmetrically, which means that the fan-out lines in the left area and the fan-out lines in the right area of the first fan-out area Q1 may be symmetrically arranged along the above-mentioned axis of symmetry Z. In the left area and the right area, the symmetrically arranged two fan-out lines may be in a same layer. For example, the first fan-out line SL1 farthest from the symmetry axis Z in the left area and the first fan-out line SL1 farthest from the symmetry axis Z in the right area may be located in a same film layer. In this way, it may be beneficial to simplify the wiring complexity of the fan-out lines, and ensure that different first fan-out lines SL1 are located in the same film layer. Accordingly, it may be beneficial to reduce the difference in coupling capacitance between different first fan-out lines SL1 and the power signal line X, thereby reducing the difference in coupling capacitance between the first data lines D01 connected to different first fan-out lines SL1, and thus may be more conducive to improving the display effect of the display panel.

Figure 4:
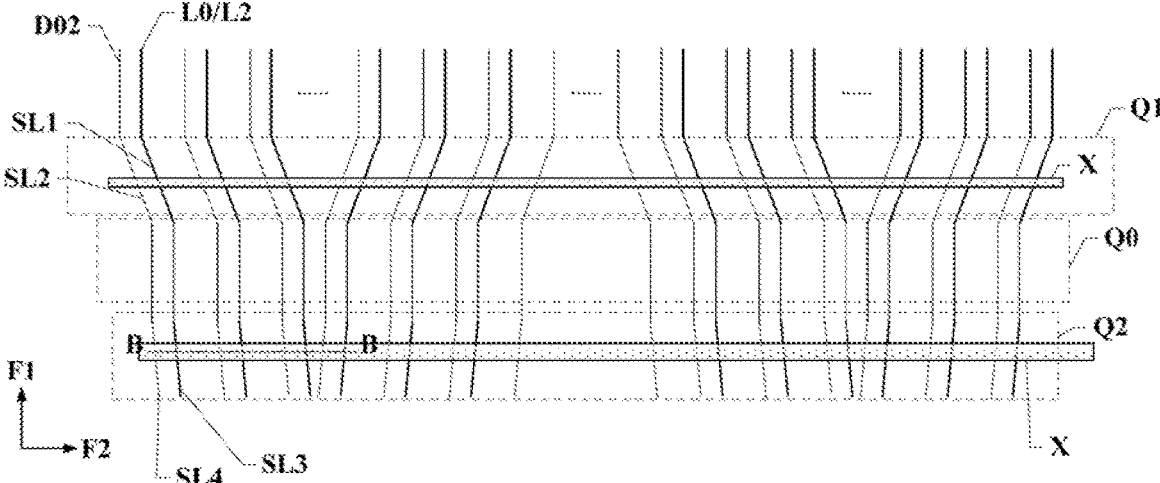
FIG. 4 illustrates an exemplary layout of a non-display area at one side of an exemplary display panel according to various disclosed embodiments of the present disclosure.
Figure 5:
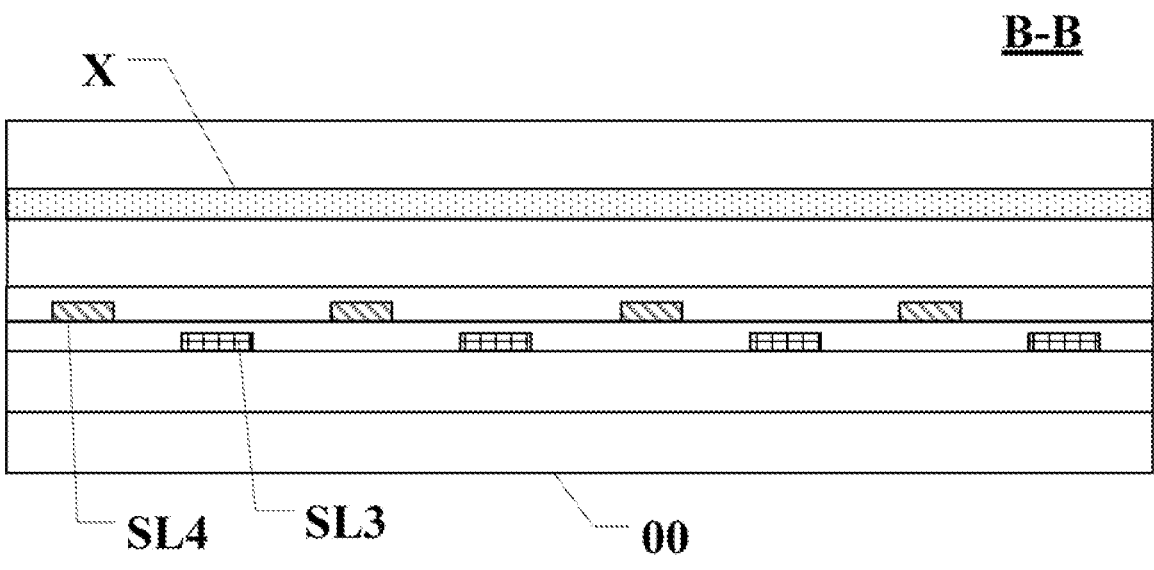
FIG. 5 illustrates an exemplary BB-sectional view of the display panel in FIG. 4.

FIG. 4 is a schematic wiring diagram of the non-display area at one side of the display panel. FIG. 5 is a BB-sectional view of the display panel in FIG. 4. As shown in FIGS. 4-5, in one embodiment, the display panel may also include a second fan-out area Q2 and a bending area Q0. The second fan-out area Q2 may be located at the side of the first fan-out area AA1 away from the display area AA0. The bending area Q0 may be located between the first fan-out area AA1 and the second fan-out area AA2. The second fan-out area AA2 may include a third fan-out line connected to the first fan-out line SL1 and a fourth fan-out line SL4 connected to the second fan-out line SL2. The third fan-out lines SL3 may be arranged on a same layer.

Specifically, this embodiment shows a scheme in which a bending area Q0 and a second fan-out area Q2 may be provided at the side of the first fan-out area Q1 away from the display area. The bending area Q0 may be located between the first fan-out area Q1 and the second fan-out area Q2. It should be noted that, to clearly illustrate the relative positional relationship between the first fan-out area Q1, the bending area Q0, and the second fan-out area Q2, FIG. 4 only shows a relative positional relationship among the three when the bending area Q0 is not bent. In an actual product, the bending area Q0 may be bent, and the second fan-out area Q2 may be bent back to the non-light-emitting surface of the display panel.

In the display panel provided by the present disclosure, the first fan-out lines SL1 in the first fan-out area Q1 may be electrically connected to the third fan-out lines SL3 in the second fan-out area Q2 in a one-to-one correspondence and the second fan-out lines SL2 in the first fan-out area Q1 may be electrically connected to the fourth fan-out lines SL4 in the second fan-out area Q2 in a one-to-one correspondence. A connection line may be provided in the bending area Q0, the first fan-out line SL1 and the third fan-out line SL3 may be electrically connected through the connection line in the bending area Q0, and the second fan-out line SL2 and the fourth fan-out line SL4 may also be electrically connected through the connection line in the bending area Q0. In one embodiment of the present disclosure, setting the third fan-out lines SL3 on the same layer may be beneficial to reduce the difference in coupling capacitance between the third fan-out lines SL3 and other film layers in the second fan-out area Q2, thereby helping to reduce the difference in the coupling capacitance between the first data lines D01 connected to different third fan-out lines SL3, and helping to solve the problem of uneven display caused by large differences in the coupling capacitance.

In one optional embodiment of the present disclosure, the first fan-out line SL1 and the third fan-out line SL3 may be arranged on a same layer. Because the first fan-out line SL1 and the third fan-out line SL3 may be electrically connected and both are electrically connected to the first data line D01, when the first fan-out line SL1 and the third fan-out line SL3 are arranged on the same layer, it may be beneficial to simplify the wiring difficulty of the fan-out line connected to the first data line D01, and simplify the production process of the display panel.

In one embodiment, in an actual production process, the first fan-out line SL1 and the third fan-out line SL3 may be arranged on the film layer farther away from the power signal line X, and the vertical distance between the first fan-out line SL1 and the third fan-out line SL3 and the power signal line X may be increased, thereby reducing the fan-out line connected to the first data line D01 from being affected by the coupling capacitance of the power signal line X, which may be beneficial to improve the accuracy of the data signal transmitted by the first data line D01.

Further, referring to FIG. 4 and FIG. 5, in one embodiment of the present disclosure, at least portions of the line segments in the power signal line X may be located in the second fan-out area Q2, and in the second fan-out area Q2, in a direction perpendicular to the plane where the display panel is located, the third fan-out line SL3 may overlap with the power signal line X.

Among the first fan-out line SL1 and the third fan-out line SL3 electrically connected to the same first data line D01, the overlapping area of the first fan-out line SL1 and the power signal line X may be smaller than the overlapping area of the third fan-out line SL3 and the power signal line X, and in the direction perpendicular to the plane where the display panel is located, the distance between the first fan-out line SL1 and the power signal line X may be smaller than the distance between the third fan-out line SL3 and the power signal line X.

Specifically, when the power signal line X is provided in both the first fan-out area Q1 and the second fan-out area Q2, in one embodiment, the width of the power signal line X in the second fan-out area Q2 in the first direction F1 may be greater than the width of the power signal line X in the first fan-out area Q1 in the first direction F1, such that, in the direction perpendicular to the plane where the display panel is located, the overlapping area between the third fan-out line SL3 and the power signal line X may be larger than the overlapping area of the first fan-out line SL1 and the power signal line X. If the first fan-out line SL1 and the second fan-out line SL2 are arranged on the same layer, the coupling capacitance between the third fan-out line SL3 and the power signal line X may be larger. In this embodiment, the first fan-out line SL1 and the third fan-out line SL3 may be arranged in different layers such that the distance between the third fan-out line SL3 and the power signal line X may be greater than the distance between the first fan-out line SL1 and the power signal line X. Accordingly, the overall coupling capacitance of the connection wiring L0 and the fan-out line connected by the connection line D01 may be reduced and it may be more conducive to reduce the problem of uneven display caused by the difference in the coupling capacitance.

Figure 6:
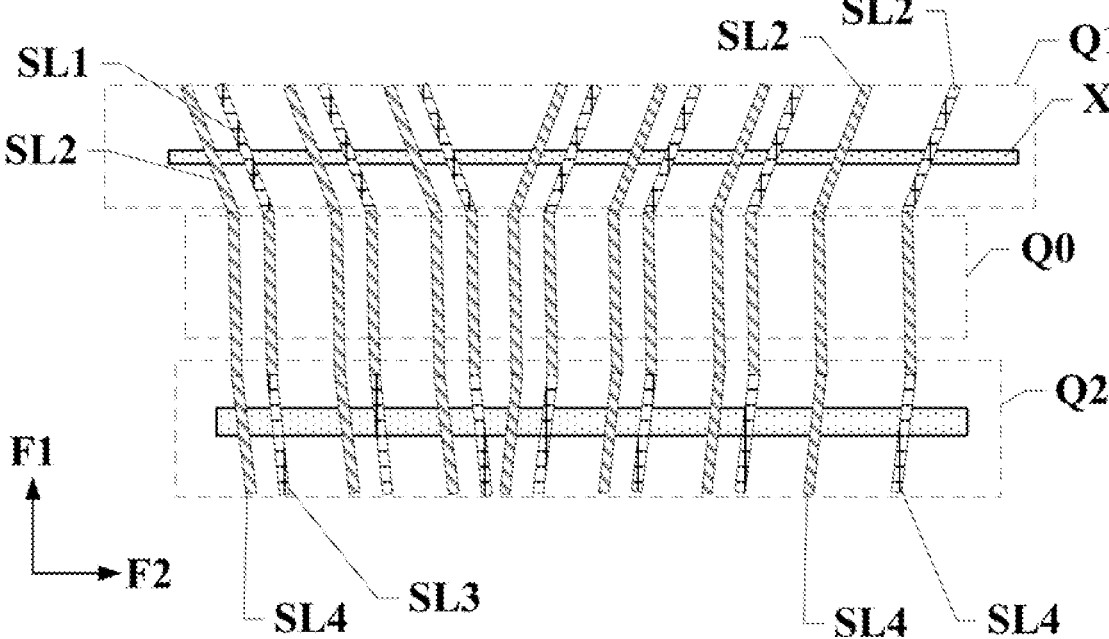
FIG. 6 illustrates an exemplary layout fan out lines connected to data lines in a single first display area.

FIG. 6 is a schematic diagram of an exemplary wiring of fan-out lines connected to data lines in a single first display area AA1. FIG. 6 uses different pattern fillings to distinguish fan-out lines. The fan-out lines filled with the same pattern may be located in the same film layer, and the fan-out lines filled with different patterns may be located in different film layers. It should be noted that the pattern filling is only to illustrate the film layer of the fan-out line, and does not limit other features of the fan-out line, for example, the thickness and quantity of the fan-out line are not limited. To clearly illustrate the relative positional relationship of the fan-out lines of different layers in the top view, FIG. 6 does not show the situation that the fan-out lines of different layers overlap in the top view. In some other embodiments of the present disclosure, the fan-out lines of different layers may also be shown as overlapping in the top view.

As shown in FIG. 6, in one embodiment of the present disclosure, the first fan-out line SL1 and its adjacent second fan-out line SL2 may be alternately arranged in different layers, and the third fan-out line SL3 and its adjacent fourth fan-out line SL4 may be alternately arranged in different layers. The configuration that the first fan-out line SL1 mentioned in this embodiment may be adjacent to its adjacent second fan-out line SL2 may mean that no other fan-out line may be arranged between the first fan-out line SL1 and the second fan-out line SL2 in the top view structure, and the configuration that the third fan-out line SL3 may be adjacent to the fourth fan-out line SL4 may mean that no other fan-out line may be arranged between the third fan-out line SL3 and the fourth fan-out line SL4 in the top view structure.

Specifically, when the first data line D01 in the first display area AA1 is electrically connected to the first fan-out line SL1 through the connection wiring L0, the first fan-out line SL1 may be interspersed between the second fan-out line SL2 connected to the second data line D02, and the third fan-out line SL3 connected to the first fan-out line SL1 may be interspersed between the fourth fan-out line SL4 connected to the second fan-out line SL2. At this time, the first fan-out line SL1 and its adjacent second fan-out line SL2 may be arranged in different film layers, and when the third fan-out line SL3 and the fourth fan-out line SL4 adjacent to it are arranged in different film layers, the first fan-out line SL1 and the third fan-out line SL3 interspersed may not affect the original wiring method of the second fan-out line SL2 and the fourth fan-out line SL4, thus helping to simplify the wiring complexity of the fan-out area. In addition, arranging the first fan-out line SL1 and its adjacent second fan-out line SL2 on different film layers, and disposing the third fan-out line SL3 and its adjacent fourth fan-out line SL4 on different film layers, and laying these signal lines through double-layer wiring may be helpful to avoid the problem that the first fan-out area Q1 occupies a large frame width caused by a single-layer wiring, and it also be beneficial to reduce the frame width occupied by the first fan-out area Q1, and may be conducive to realizing a narrow frame design of the display panel.

Further, referring to FIG. 6, in one embodiment of the present disclosure, the multiple second fan-out lines SL2 that are not adjacent to the first fan-out line SL1 may be distributed on at least two different film layers and arranged alternately, and the multiple fourth fan-out lines SL4 that are not adjacent to the third fan-out lines SL3 may be distributed in at least two different film layers and may be arranged alternately.

Specifically, some of the second fan-out lines SL2 in the display panel may not be adjacent to the first fan-out line SL1 (for example, the two second fan-out lines SL2 on the far right in FIG. 6). At the same time, some of the third fan-out lines SL3 may not be adjacent to the fourth fan-out lines SL4. In the present disclosure, the second fan-out lines SL2 that are not adjacent to the first fan-out lines SL1 are alternatively distributed in two layers, and the third fan-out lines SL3 that are not adjacent to the fourth fan-out lines SL4 may be alternatively distributed in different layers. Such a configuration may be effectively utilized the layer structure of the first fan-out area. Further, the double-layer layout method may also be conducive to reducing the space occupied by the first fan-out area Q1. The first fan-out area Q1 may be located at the lower frame of the display panel, when the space occupied by the first fan-out area Q1 is reduced, it may be beneficial to further realize the narrow frame design of the display panel.

Figure 7:
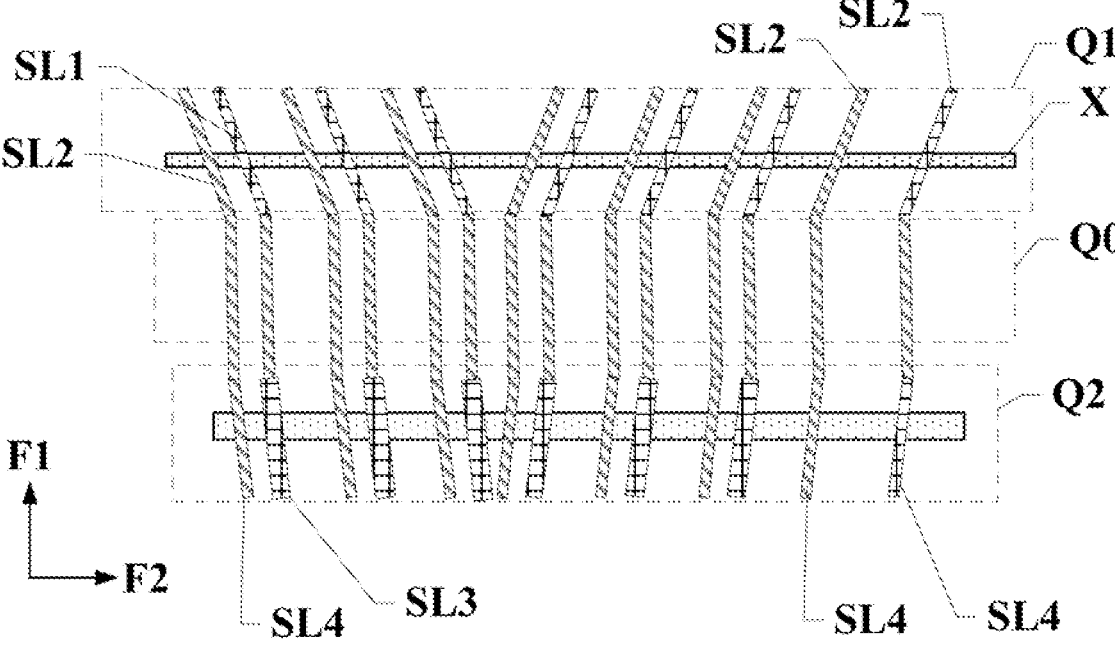
FIG. 7 illustrates an exemplary layout fan out lines connected to data lines in a single first display area.

FIG. 7 is a schematic diagram of another exemplary wiring diagram of fan-out lines connected to data lines in a single first display area AA1. This embodiment shows a scheme for designing different line widths of fan-out lines in the second fan-out area Q2.

As shown in FIG. 7, in one embodiment of the present disclosure, in the second fan-out area Q2, the line width of the third fan-out line SL3 may be greater than the line width of the fourth fan-out line SL4.

Specifically, in actual products, to realize the narrow frame design of the display panel, the space occupied by the first fan-out area Q1 should not be too large, and because the second fan-out area Q2 may eventually be folded back to the non-light-emitting surface of the display panel through the bending area Q0, in the arrangement direction of the first fan-out area Q1 and the second fan-out area Q2, the width of the second fan-out area Q2 may be greater than the width of the first fan-out area Q1. When the connection wiring L0 is introduced into the display panel to be electrically connected to the first data line D01, the existence of the connection wiring may increase the overall impedance of the first data line D01. To reduce the impedance difference between the first data line D01 and the second data line D02, the embodiment of the present disclosure may differentiate the width of the third fan-out line SL3 electrically connected to the first data line D01 in the second fan-out area Q2 and the width of the fourth fan-out line SL4 electrically connected to the second data line D02. The width of the third fan-out line may be set to be greater than the width of the fourth fan-out line SL4 such that the impedance of the third fan-out line SL3 may be smaller than the impedance of the fourth fan-out line SL4, which may be equivalent to reducing the overall impedance of the first data line D01. Accordingly, it may be conducive to balancing the impedance difference between the first data line D01 and the second data line D02, and reducing the problem of uneven display caused by the large impedance difference between the first data line D01 and the second data line D02. Further, because the second fan-out area Q2 may be folded back to the non-light-emitting surface of the display panel, increasing the width of the third fan-out line SL3 in the second fan-out area Q2 may not affect the frame width of the display panel even if the space of the second fan-out area Q2 is increased, which may be equivalent to effectively utilizing the space on the side of the non-light-emitting surface of the display panel.

Further, referring to FIG. 6 and FIG. 7, in one embodiment, along the first direction F1, the n-th fan-out line in the first fan-out area Q1 may be electrically connected to the n-th fan-out line in the second fan-out area Q2. n>1, and n may be an integer.

Specifically, referring to FIG. 1, if the connection wiring L0 is not introduced into the display panel, the arrangement order of the data lines in the display area may be same as the arrangement order of the fan-out lines in the first fan-out area Q1. When the connection wiring L0 is introduced into the display panel, when the connection wiring L0 intersperses and arranges the first fan-out lines SL1 electrically connected to the first data line D01 between the second fan-out lines SL2 electrically connected to the second data lines D02, the arrangement sequence of the fan-out lines in the first fan-out area Q1 may be no longer same as that of the data lines in the display area.

In one embodiment of the present disclosure, the arrangement order of the fan-out lines in the second fan-out area Q2 may be set to be the same as the arrangement order of the fan-out lines in the first fan-out area Q1, for example, the order of the out-of-order fan-out lines may not be adjusted in the second fan-out area Q2, and the arrangement order consistent with that of the first fan-out area Q1 may be maintained. In the related art, when the out-of-order fan-out lines are sequenced in the second fan-out area Q2, the fan-out lines will inevitably be wound. The corresponding resistive and capacitive loads increase the load difference corresponding to different data lines, resulting in uneven display. However, in the present disclosure, the out-of-order fan-out line may not be sequenced in the second fan-out area Q2, and the out-of-order functional soldering pads may be matched with the out-of-order function ICs, thereby avoiding the phenomenon of fan-out line winding in the second fan-out area Q2, which may in turn help to reduce the length difference of different fan-out lines, and further help to reduce the load difference of the data lines connected to different fan-out lines.

Figure 8:
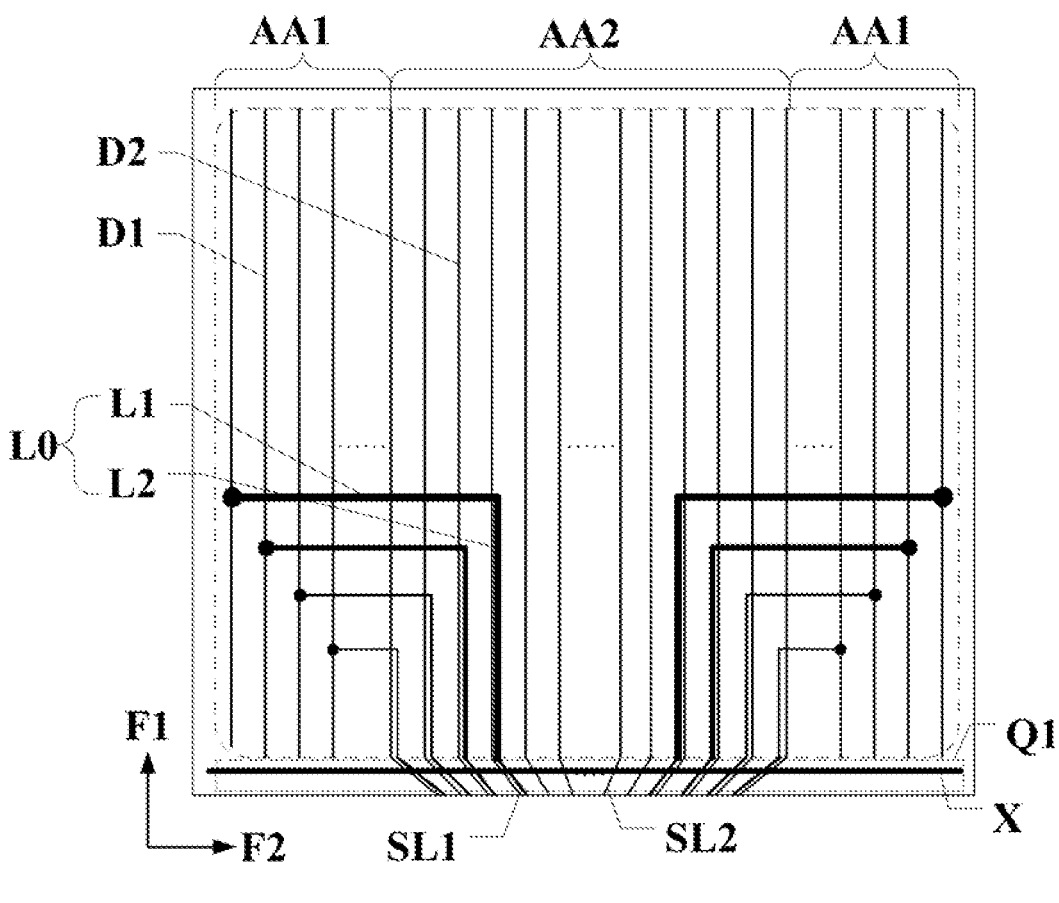
FIG. 8 illustrates an exemplary layout of connection wirings in a display area.

FIG. 8 is a schematic diagram of an exemplary layout of the connection wiring L0 in the display area, and this embodiment shows a solution for a differentiated design of the line widths of the connection wirings L0.

As shown in FIG. 8, in one embodiment of the present disclosure, in the direction from the first display area AA1 to the second display area AA2, the lengths of the connection wirings L0 corresponding to different first data lines D01 may decrease gradually, and the line width of the connection wiring L0 with a larger length may be greater than the line width of the connection wiring L0 with a smaller length. It should be noted that, in the embodiment of FIG. 8, the connection wirings L0 with different thicknesses are used to illustrate the connection wirings L0 with different widths. In FIG. 8, the connection wirings L0 with larger line widths correspond to thicker connection wirings L0.

In one embodiment, in the direction from the first display area AA1 to the second display area AA2, the longer the connection line L0 connected to the first data line D01 farther away from the second display area AA2, the closer the longitudinal segment of the connection wiring L0 connected to the first data line D01 to the second display area AA2. When the line widths of the connection wirings L0 are consistent, the longer the connection wirings L0 are, the greater their corresponding impedances may be, and the impedance differences corresponding to different first data lines D01 will be greater. In this embodiment, the line widths of the connection wirings L0 with different lengths may be designed in a differentiated manner such that the line width of the connection wirings L0 with a larger length may be greater than the line width of the connection wirings L0 with a shorter length, thereby reducing the impedance of the connection wirings L0 with a larger length and reducing the impedance difference between the connection lines L0 with different lengths. Accordingly, it may be beneficial to reduce the impedance difference corresponding to different first data lines D01 and improve the display uniformity of the display panel.

It should be noted that FIG. 8 only shows a scheme in which the lengths of the connection lines L0 corresponding to different first data lines D01 decrease gradually along the direction from the first display area AA1 to the second display area AA2. In some other embodiments of the present disclosure, in the direction from the first display area AA1 to the second display area AA2, the lengths of the connection wirings L0 corresponding to different first data lines D01 may also decrease, which is not limited in the present disclosure.

Further, referring to FIG. 6, this embodiment shows a scheme in which the first fan-out line SL1 and the second fan-out line SL2 in the first fan-out area Q1 are located in different film layers.

Referring to FIG. 6 and FIG. 2, in one embodiment, in the direction perpendicular to the plane where the display panel is located, the vertical distance between the first fan-out line SL1 overlapping with the power signal line X and the power signal line X may be D1, the vertical distance between the second fan-out line SL2 overlapping with the power signal line X and the power signal line X may be D2, and D1>D2.

In one embodiment of the present disclosure, the first fan-out line SL1 may be electrically connected to the first data line D01 through the connection wiring L0, and the second fan-out line SL2 may be electrically connected to the second data line D02, and the connection line L0 may not be introduced between the two, that is, the first data line D01 may increase the coupling capacitance caused by the connection wiring L0 compared with the second data line D02. In the first fan-out area Q1, the embodiment of the present disclosure may set the distance D1 between the first fan-out line SL1 and the power signal line X to be larger than the distance D2 between the second fan-out line SL2 and the power signal line X to reduce the coupling capacitance between the first fan-out line SL1 and the power signal line X, thereby reducing the overall coupling capacitance of the first data line D01 connected to the first fan-out line SL1 and the connection wiring L0. Accordingly, the coupling capacitance difference between the first data line D01 and the second data line D02 may be reduced, and the display unevenness due to large differences in coupling capacitance between first data line D01 and the second data line D02 may be reduced. Thus, it may be beneficial to improve the display brightness uniformity of the first display area AA1 and the second display area AA2 and improve the overall display effect of the display panel.

Figure 9:
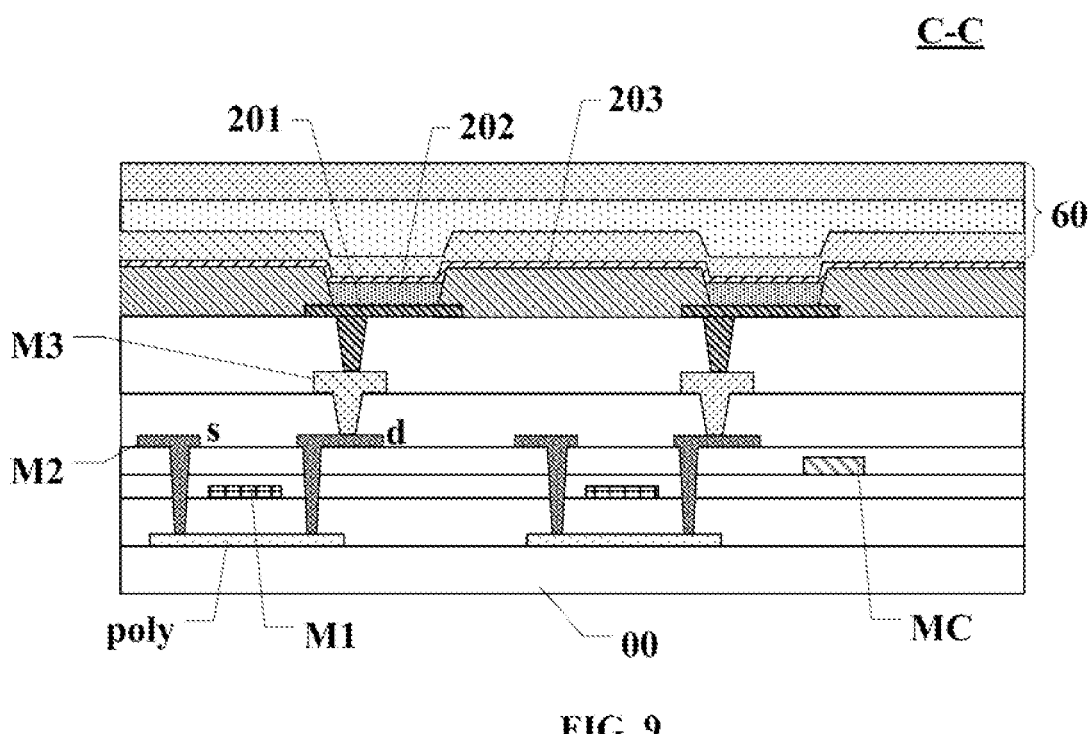
FIG. 9 illustrates an exemplary CC-sectional view of the display panel in FIG. 1.

FIG. 9 is a CC-sectional view of the display panel in FIG. 1, and this embodiment schematically illustrates a film layer structure of the display panel.

As shown in FIG. 1 and FIG. 9, in one embodiment of the present disclosure, the display panel may include a substrate 00 and a first metal layer M1, a capacitor metal layer MC, a second metal layer M2 and a third metal layer M3 arranged on the same side of the substrate 00. The first metal layer M1 may be located between the substrate 00 and the capacitor metal layer MC, the second metal layer M2 may be located between the capacitor metal layer MC and the third metal layer M3, and the third metal layer M3 may be located on the side of the second metal layer M2 away from the substrate 00. The power signal line X may be located between the second metal layer M2 and the third metal layer M3, the first fan-out line SL1 may be located on the first metal layer M1, and the second fan-out line SL2 may be located on the capacitor metal layer MC.

In one embodiment, the display panel may further include a semiconductor layer poly, and the semiconductor layer poly may be located on a side of the first metal layer M1 away from the substrate 00, or on a side of the first metal layer M1 facing the substrate 00. The first metal layer M1 may be, for example, a gate metal layer, and the gates of some transistors in the display panel may be disposed on the first metal layer M1. The capacitor metal layer MC may be configured to form a capacitive structure with the first metal layer M1 or the second metal layer M2. The source electrode s and the drain electrode d of the transistor in the display panel may be located on the second metal layer M2, and the semiconductor layer poly may include a source region and a drain region. The source region and the drain region may be formed by doping N-type impurity ions or P-type impurity ions. The source electrode of the transistor may be electrically connected to the source region of the semiconductor layer through the contact hole, and the drain electrode of the transistor may be electrically connected to the drain region of the semiconductor layer through the contact hole.

The display panel may be a display panel using the organic light-emitting diode display technology, that is, an organic light-emitting diode (OLED) display panel. The basic structure of the light-emitting functional layer of the OLED display panel may include an anode 201, a light-emitting layer 202 and a cathode 203. When the power source supplies an appropriate voltage, the holes in the anode 201 and the electrons in the cathode 203 may combine in the light-emitting material layer to generate bright light. In one embodiment, an encapsulation layer 60 may be further provided on the side of the cathode 203 away from the anode 201. Compared with the thin film field-effect transistor liquid crystal displays, OLED display devices may have the characteristics of high visibility and high brightness, and may be more power-saving, lighter in weight, and thinner in thickness. Certainly, in some other embodiments of the present disclosure, the display panel may also be a display panel using an inorganic light-emitting diode display technology, such as a Micro LED display panel, or a Mini LED display panel, etc.

Further, referring to FIG. 2 and FIG. 9, this embodiment takes the power signal line X in the first fan-out area Q1 located in the third metal layer M3 as an example for illustration, but does not limit the actual film layer where the power signal line X is located. In one embodiment of the present disclosure, the power signal line X in the first fan-out area Q1 may also be arranged in the second metal layer M2. Of course, to reduce the impedance of the power signal line X, the power signal line X may also be arranged in parallel on the second metal layer M2 and the third metal layer M3.

In one embodiment, the first fan-out line SL1 may be arranged on the first metal layer M1, and the second fan-out line SL2 may arranged on the capacitor metal layer MC. Compared with the capacitor metal layer MC, the first metal layer M1 may be farther away from the power signal line X. Therefore, when the first fan-out line SL1 is arranged on the first metal layer M1, it may be beneficial to reduce the coupling capacitance between the first fan-out line SL1 and the power signal line X, thereby reducing the coupling capacitance between the first data line D01 and the second data line D02 due to the connection with the connection wiring L0. Accordingly, it may be beneficial to improve the overall display uniformity of the first display area AA1 and the second display area AA2.

Figure 10:
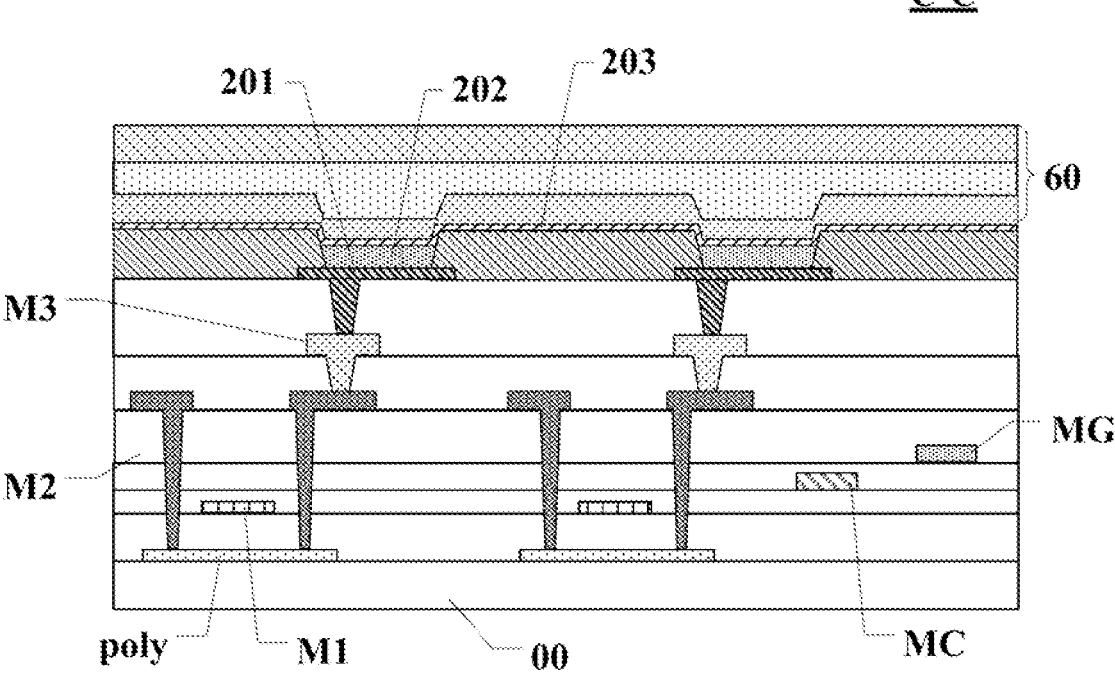
Figure 11:
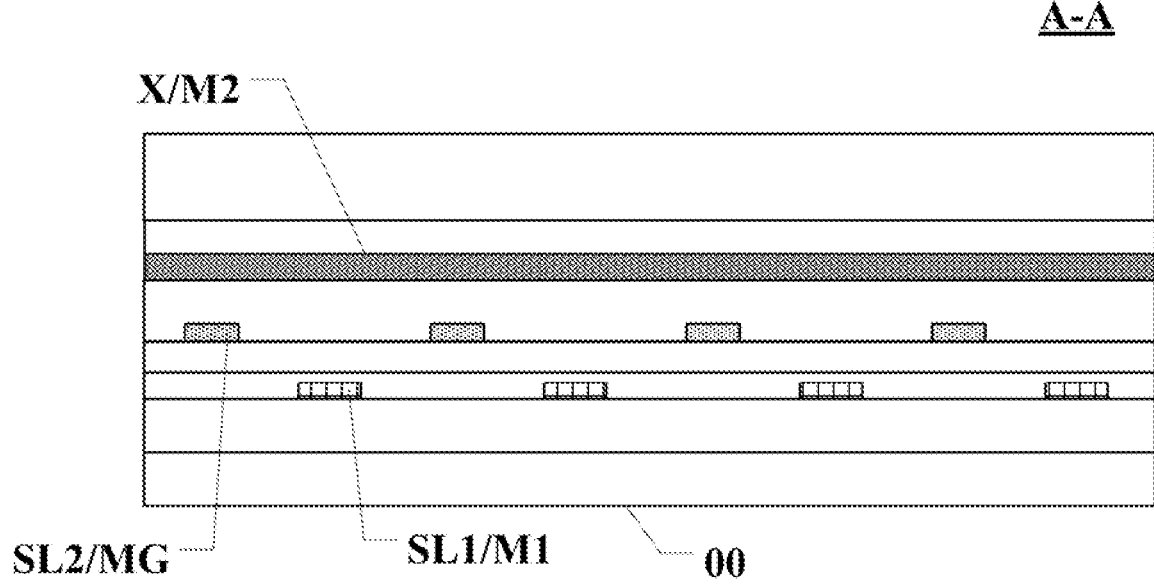
FIG. 11 illustrates another exemplary AA-sectional view of the display panel in FIG. 1.

FIG. 10 is another exemplary CC-sectional view of the display panel in FIG. 1. This embodiment illustrates another film layer structure of the display panel. FIG. 11 is another exemplary AA-sectional view of the display panel in FIG. 1.

As shown in FIG. 10 and FIG. 11, in one embodiment, the display panel may include a substrate 00 and a first metal layer M1, a capacitor metal layer MC, a gate metal layer MG, a second metal layer M2, and a third metal layer M3 arranged on the same side of the substrate 00. The first metal layer M1 may be located between the substrate 00 and the capacitor metal layer MC. The gate metal layer MG may be located on the side of the capacitor metal layer MC away from the substrate 00. The second metal layer M2 may be located on the side of the gate metal layer MG away from the substrate 00, and the third metal layer M3 may be located on the side of the second metal layer M2 away from the substrate 00. The power signal line X may be located on at least one of the second metal layer M2 and the third metal layer M3. The first fan-out line SL1 may be located on the first metal layer M1, and the second fan-out line SL2 may be located on the capacitor metal layer MC or the gate metal layer MG. In some embodiments, the first fan-out line SL1 may be located on the capacitor metal layer MC, and the second fan-out line SL2 may be located on the gate metal layer MG.

Specifically, this embodiment shows a solution that the display panel may further include a gate metal layer MG. When a transistor with a double-gate structure is provided in the display panel, one gate of the double-gate structure may be located at the gate metal layer MG. In one embodiment, when the gate metal layer MG is introduced into the display panel, it may be equivalent to adding a metal film layer in the display panel, and the gate metal layer MG may be located on the side of the second metal layer M2 facing the substrate 00. The power signal line X in this embodiment may also be located on at least one of the second metal layer M2 and the third metal layer M3. In this embodiment, the configuration that the power signal line X in the first fan-out area Q1 is located on the second metal layer M2 is used as an example for illustration. Because the first metal layer M1, the capacitive metal layer MC and the gate metal layer MG may be arranged on the side of the second metal layer M2 facing the substrate 00, when arranging the first fan-out line SL1 and the second fan-out line SL2, the first fan-out line SL1 may be arranged on a metal layer farther from the power signal line X, and the second fan-out line SL2 may be arranged on a film layer closer to the power signal line X. In this way, the distance between the first fan-out line SL1 and the second fan-out line SL2 and the power signal line X may also be designed in a differentiated manner, the coupling capacitance between the first fan-out line SL1 and the power signal line X may be reduced, and the difference in coupling capacitance between the first data line D01 connected to the first fan-out line SL1 and the second data line D02 connected to the second fan-out line SL2 may be reduced, thereby helping to reduce the problem of uneven brightness between the first display area AA1 and the second display area AA2 due to the difference in coupling capacitance. Accordingly, the overall display effect of the display panel may be improved.

Figure 12:
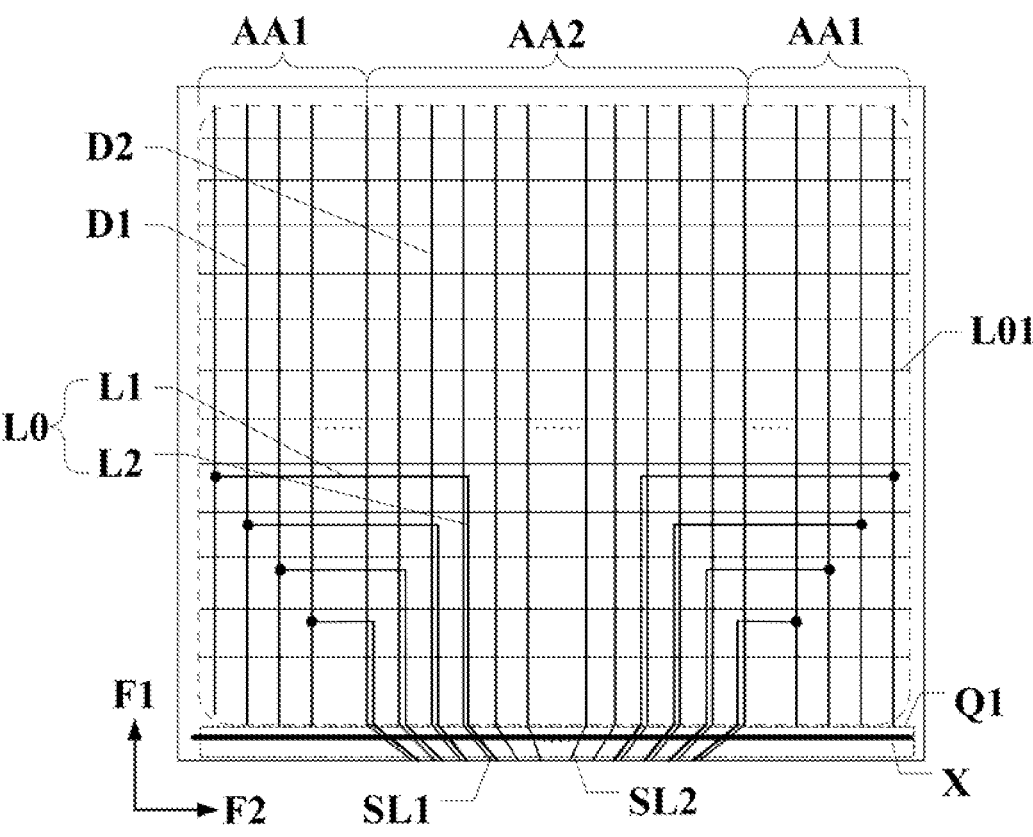
FIG. 12 illustrates an exemplary relative positional relationship between a connection wiring and a first signal line according to various disclosed embodiments of the present disclosure.

FIG. 12 is a diagram showing an exemplary relative positional relationship between the connection wiring L0 and the first signal line in one embodiment of the present disclosure. As shown in FIG. 12, in one embodiment of the present disclosure, the connection wiring L0 may include a first connection wiring L1 extending in the first direction F1 and a second connection wiring L2 extending in the second direction F2. The first connection wiring L1 may not overlap with the first signal line L01.

Specifically, the first data line D01 in this embodiment may be electrically connected to the first connection wiring L1 extending in the first direction F1 among the connection lines L0, and the first connection wiring L1 may be electrically connected to the first fan-out line SL1 through the second connection wiring L2 extending in the second direction F2. The first direction F1 may be the row direction, and the second direction F2 may be the column direction. The first connection wiring L1 and the second connection wiring L2 in the connection wirings L0 may be respectively set to extend in the first direction F1 and the second direction F2, which may be beneficial to simplify the wiring difficulty of the connection wirings L0.

The display panel may also include the first signal line L01 extending in the first direction F1. When the first connection wiring L1 extending the F1 extension in the display panel is introduced in the display panel, it may further limit the first connection wiring L1 and the first signal ling L01 may not overlap with each other along the direction of the plane where the display panel is located. Accordingly, the impact of capacitance between the first connection wiring L1 and the first signal line L01 on the signal transmitted may be reduced, which may be conducive to improving the accuracy of the signal transmission.

Figure 13:
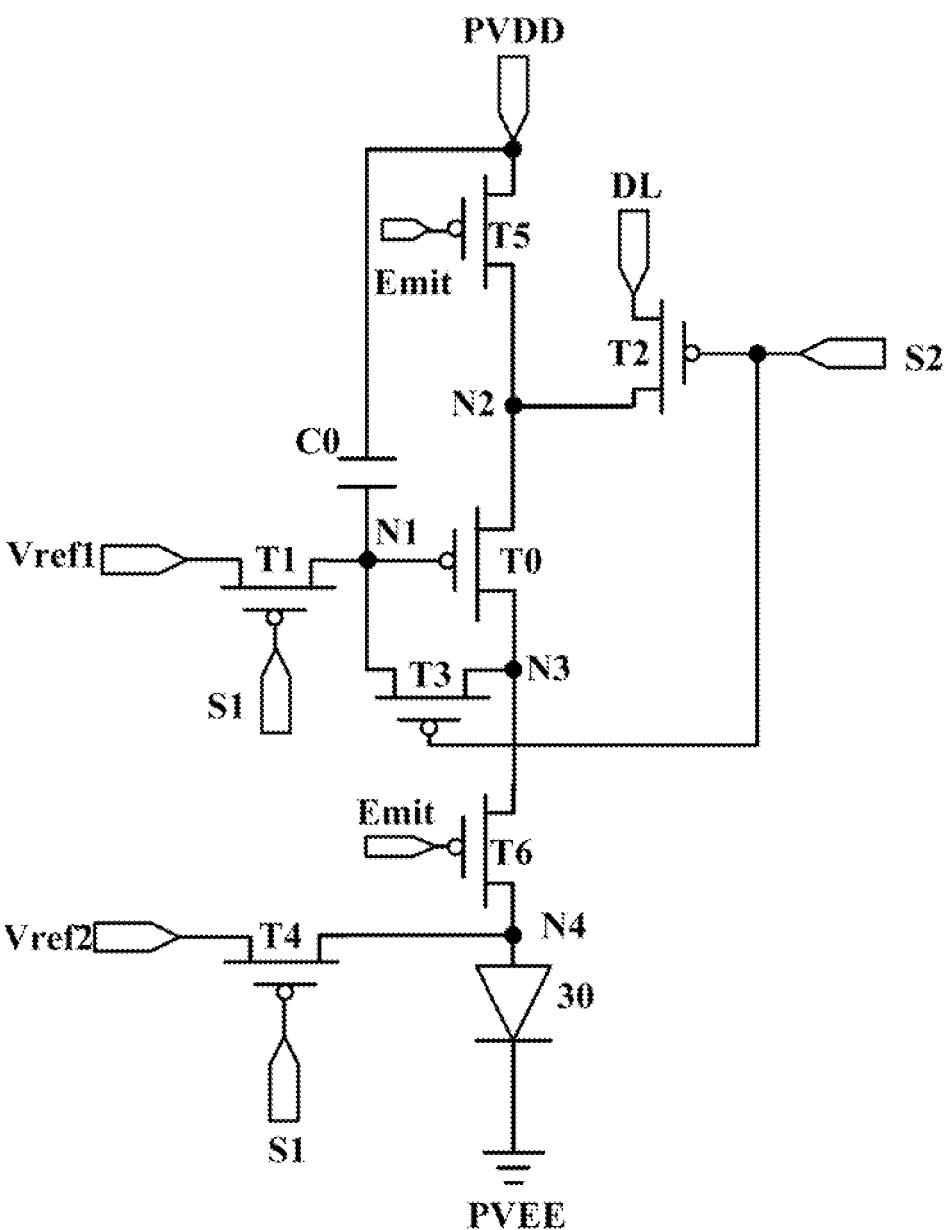
FIG. 13 illustrates an exemplary circuit diagram according to various disclosed embodiments of the present disclosure.

FIG. 13 is a schematic circuit diagram of an exemplary pixel circuit provided by one embodiment of the present disclosure. As shown in FIG. 13, in one embodiment, the structure of the pixel circuit may be a 7T1C structure (including seven transistors and a capacitor). The actual structure of the pixel circuit is not limited. In some other embodiments of the present disclosure, the pixel circuit may also be embodied as other structure, such as 8T1C or 8T2C.

In one embodiment of the present disclosure, the display panel may include a plurality of pixel circuits, and the pixel circuits may at least be electrically connected to data lines, scan lines, light-emitting control signal lines, and reset signal lines. The first signal line L01 may include at least one of the scan lines, light-emitting control signal lines, and reset signal lines.

Taking the pixel circuit shown in FIG. 13 as an example, the pixel circuit may include a driving transistor T0, a first transistor T1 to a sixth transistor T6, and a storage capacitor C0. In one embodiment, the gate of the driving transistor T0 may be connected to the first node N1, the first terminal of the driving transistor T0 may be connected to the second node N2, and the second terminal of the driving transistor T0 may be connected to the third node N3. The light-emitting element 30 may be connected in series between the fourth node N4 and the second power supply terminal PVEE. The first transistor T1 may be connected in series between the first reset terminal Vref1 and the first node N1; the second transistor T2 may be connected in series between the data signal line DL and the second node N2; the third transistor T3 may be connected in series between the first node N1 and the third node N3; the fourth transistor T4 may be connected in series between the second reset terminal Vref2 and the fourth node N4; the fifth transistor T5 may be connected in series between the first power supply terminal PVDD and the second node N2; the sixth transistor T6 may be connected in series between the third node N3 and the fourth node N4; and the storage capacitor C0 may be connected in series between the first power supply terminal PVDD and the first node N1. The control terminal S1 of the first transistor T1, the control terminal S2 of the second transistor T2, the control terminal S2 of the third transistor T3, and the control terminal S1 of the fourth transistor T4 may be respectively electrically connected to the scanning line. The control terminals Emit of the fifth transistor T5 and the sixth transistor T6 may be electrically connected to the light-emitting control signal line. The first reset terminal Vref1 and the second reset terminal Vref2 corresponding to the first transistor T1 and the fourth transistor T4 may be respectively connected to the reset signal lines. In one embodiment, the scan lines, the light-emitting control signal lines and the reset signal lines may all extend along the first direction F1.

In one embodiment, when the connection wiring L0 is introduced into the display panel, the first connection wiring L1 extending in the first direction F1 among the connection wirings L0 may not overlap with the scan line, the reset signal line, and the light-emitting control signal line, thereby helping to avoid the influence of coupling capacitance on the accuracy of signals transmitted on these signal lines.

Further, referring to FIG. 12, in one embodiment, in a direction perpendicular to the plane where the display panel is located, the second connection wiring L2 may not overlap with the data lines (D1 and D2).

Considering that the second connection wirings L2 may be electrically connected to the first data line D01, when the second connection wirings L2 is interspersed in the second display area AA2 where the second data lines D02 are located, the second connection wirings L2 may set not to overlap with the data lines, which may be beneficial to reduce or avoid the coupling capacitance generated between the second connection wiring L2 and the data line, thereby reducing the influence of the coupling capacitance on the signal transmitted in the data line, and improving the display stability and accuracy of the display panel.

Figure 14:
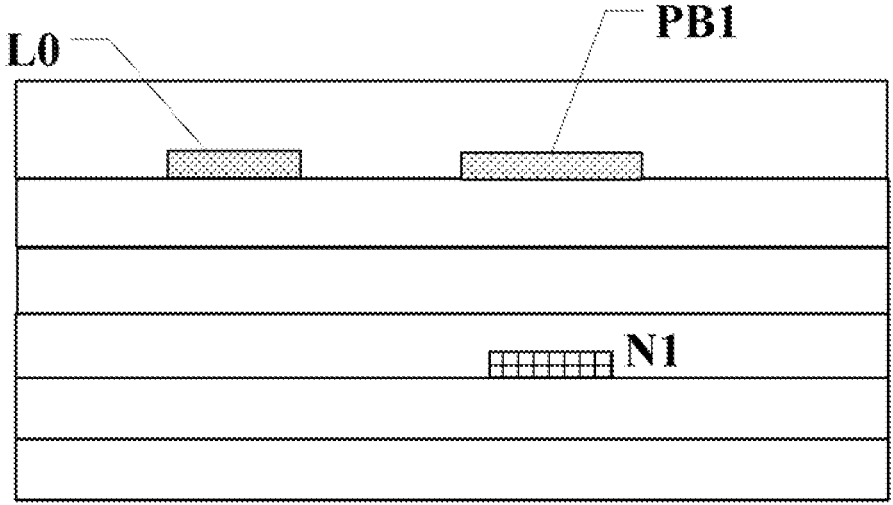
FIG. 14 illustrates an exemplary positional relationship between a first shielding layer and a first node according to various disclosed embodiments of the present disclosure.
Figure 15:
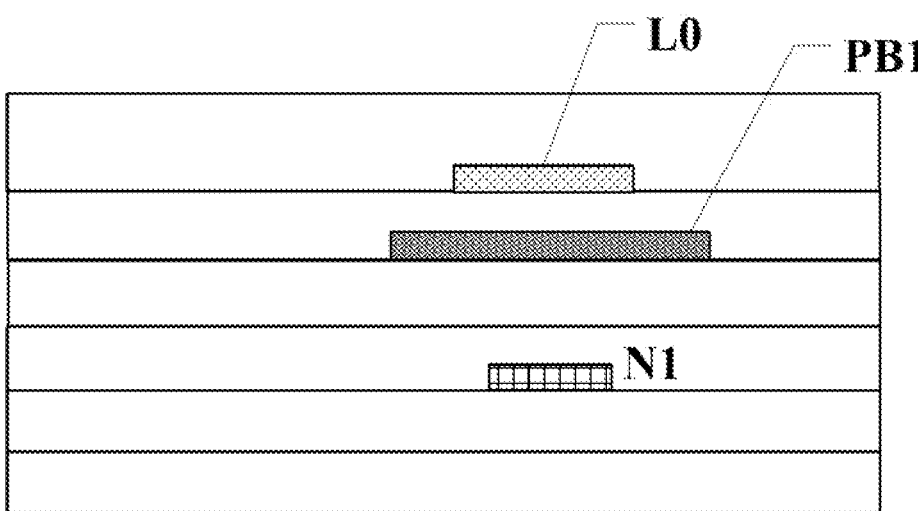
FIG. 15 illustrates another exemplary positional relationship between a first shielding layer and a first node according to various disclosed embodiments of the present disclosure.

FIG. 14 shows an exemplary relative positional relationship between a first shielding layer PB1 and the first node N1. FIG. 15 shows another exemplary relative positional relationship between the first shielding layer PB1 and the first node N1.

As shown in FIG. 13-FIG. 15, in one embodiment of the present disclosure, the display panel may include a plurality of pixel circuits. The pixel circuit may include a driving transistor T0. The gate of the driving transistor T0 may be connected to the first node N1. The display panel may also include a first shielding layer PB1. The first shielding layer PB1 may be located on the side of the first node N1 facing the light-emitting surface of the display panel and may overlap the first node N1. The first shielding layer PB1 may receive a constant potential signal.

The first shielding layer PB may be disposed on a same layer as a portion of the line segments in the connection wirings L0. In some embodiments, the first shielding layer PB1 may be located between a portion of the line segments in the connection wirings L0 and the first node N1.

Specifically, FIG. 14 shows a scheme in which the first shielding layer PB1 is disposed above the first node N1, and the first shielding layer PB1 is disposed on a same layer as some line segments of the connection wirings L0. When some line segments of the connection wirings L0 is set above the first node N1 and do not overlap with the first node N1, there may be coupling capacitance caused by a transverse electric field between the connection wiring L0 and the first node N1. Therefore, when the first shielding layer PB1 is provided directly above the first node N1 and the first shielding layer PB1 is arranged on the same layer as the aforementioned connection wirings L0, the first shielding layer PB1 may shield the transverse electric field between the connection wiring L0 and the first node N1, thereby preventing the introduction of the connection wiring L0 from affecting the potential of the first node N1, which may be beneficial to improving the display accuracy of the display panel.

FIG. 15 shows a scheme of introducing a first shielding layer PB1 between the connection wiring L0 and the first node N1 in a direction perpendicular to the plane where the display panel is located. When the connection wiring L0 overlaps with the first node N1 and the first shielding layer PB1 is introduced between the two, the first shielding layer PB1 may shield the coupling interference of the signal on the connection wiring L0 to the signal of the first node N1, thereby reducing the influence of the connection wiring L0 on the potential of the first node N1, which may be also conducive to improving the display accuracy of the display panel.

Further, referring to FIG. 13, in one embodiment, the display panel may include power signal lines X, and at least a portion of the line segments of the power signal lines X may be multiplexed as the first shielding layer PB1.

The display panel is provided with a power signal line X for providing power signals to the pixel circuits, such as a positive power signal line pvdd connected to the light emitting control module, and a negative power signal line pvee connected to the cathode of the light-emitting element. Among them, both the positive power signal line pvdd and the negative power signal line pvee may transmit constant voltage signals. When a portion of the line segments of the power signal line X is multiplexed as the first shielding layer PB1, there may be no need to introduce a new film layer for the first shielding layer PB1 in the display panel, which may be conducive to simplifying the film layer structure of the display panel and improving the production efficiency of the display panel.

It should be noted that, in one embodiment of the present disclosure, the power signal line X located in the first fan-out area may be at least one of the above-mentioned positive power signal line pvdd and the negative power signal line pvee, and the power signal line X located in the second fan-out area may be at least one of the above-mentioned positive power signal line pvdd and the negative power signal line pvee.

Figure 16:
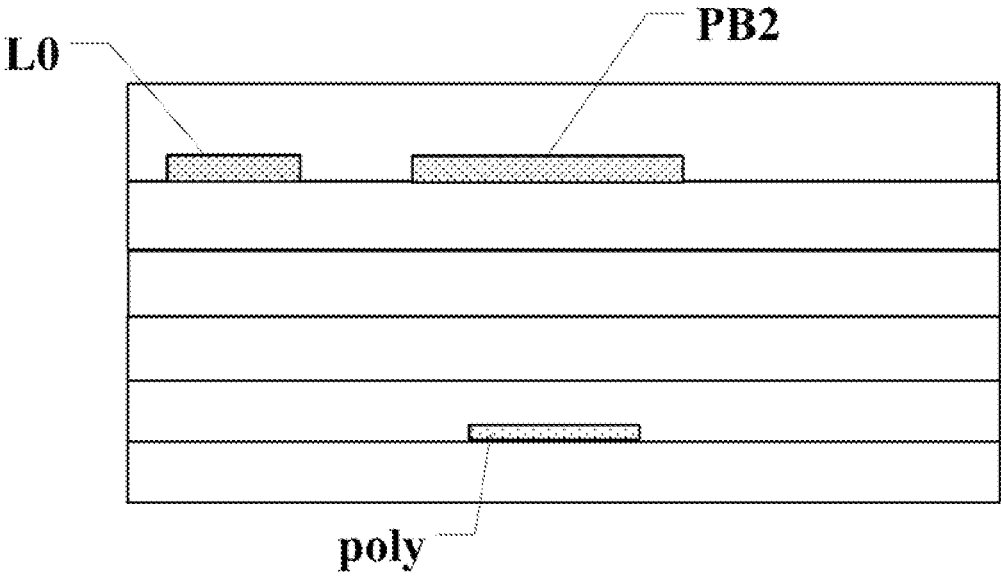
FIG. 16 illustrates an exemplary positional relationship between a second shielding layer and a compensation transistor according to various disclosed embodiments of the present disclosure.
Figure 17:
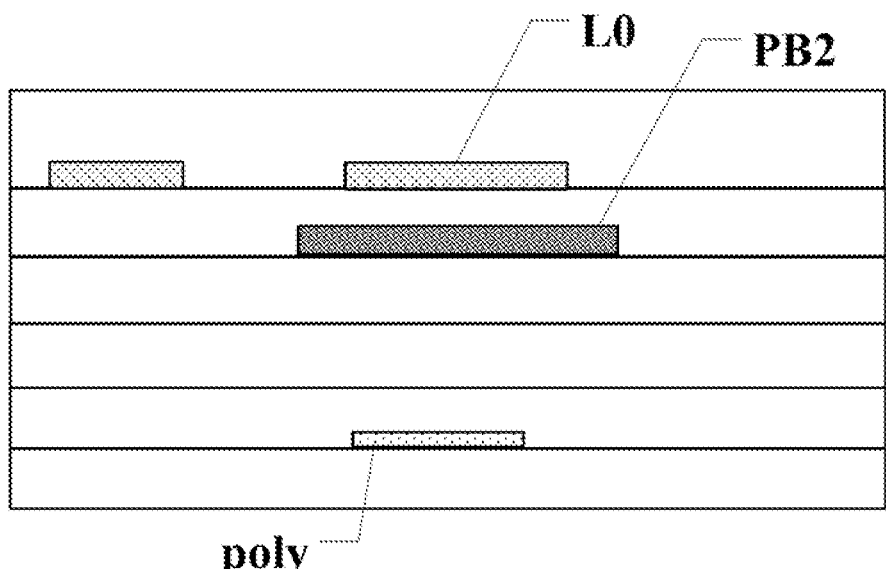
FIG. 17 illustrates another exemplary positional relationship between a second shielding layer and a compensation transistor according to various disclosed embodiments of the present disclosure.

FIG. 16 shows an exemplary relative positional relationship between a second shielding layer PB2 and the compensation transistor. FIG. 17 shows another exemplary relative positional relationship between the second shielding layer PB2 and the compensation transistor.

As shown in FIG. 13 and FIGS. 16-17, in one embodiment of the present disclosure, the display panel may include a plurality of pixel circuits. The pixel circuit may include a driving transistor T0 and a compensation transistor. The compensation transistor may be the third transistor T3 in FIG. 13. The gate of the driving transistor T0 may be connected to the first node N1. The compensation transistor T3 may be connected between the first node N1 and the output terminal of the driving transistor. The display panel may also include a second shielding layer PB2. The second shielding layer PB2 may be located on a side of the active layer PB2 facing the light-exiting surface of the display panel and may overlap with the active layer poly. The second shielding layer PB2 may receive a constant potential signal.

The second shielding layer PB2 may be disposed on a same layer as a portion of the line segments of the connection wirings L0. In some embodiments, the second shielding layer PB2 may be located between a portion of the line segments of the connection wirings L0 and the active layer of the compensation transistor.

FIG. 16 shows a scheme in which the second shielding layer PB2 is provided above the compensation transistor, and the active layer of the compensation transistor T3 is provided on a same layer as a portion of the line segments of the connection wirings L0. When a portion of the line segments of the connection wiring L0 is set above and not to overlap with the active layer of the compensation transistor, there may be a coupling capacitance caused by a lateral electric field between the connection wiring L0 and the active layer of the compensation transistor. Therefore, when the second shielding layer PB2 is provided directly above the first node N1 and is arranged on the same layer as the aforementioned connection wiring L0, the second shielding layer PB2 may shield the lateral electric field between the connection wiring L0 and the active layer of the compensation transistor, thereby preventing the introduction of the connection wiring L0 from affecting the electrical signal of the compensation transistor, which may be beneficial to improving the display accuracy of the display panel.

FIG. 17 shows a scheme of introducing a second shielding layer PB2 between the connection wiring L0 and the active layer of the compensation transistor in the direction perpendicular to the plane where the display panel is located. When the connection wiring L0 overlaps with the active layer of the compensation transistor and the second shielding layer PB2 is introduced between the two, the second shielding layer PB2 may shield the coupling interference of the signal on the connection wiring L0 to the signal of the compensation transistor, which may also be conducive to improving the display accuracy of the display panel.

Figure 18:
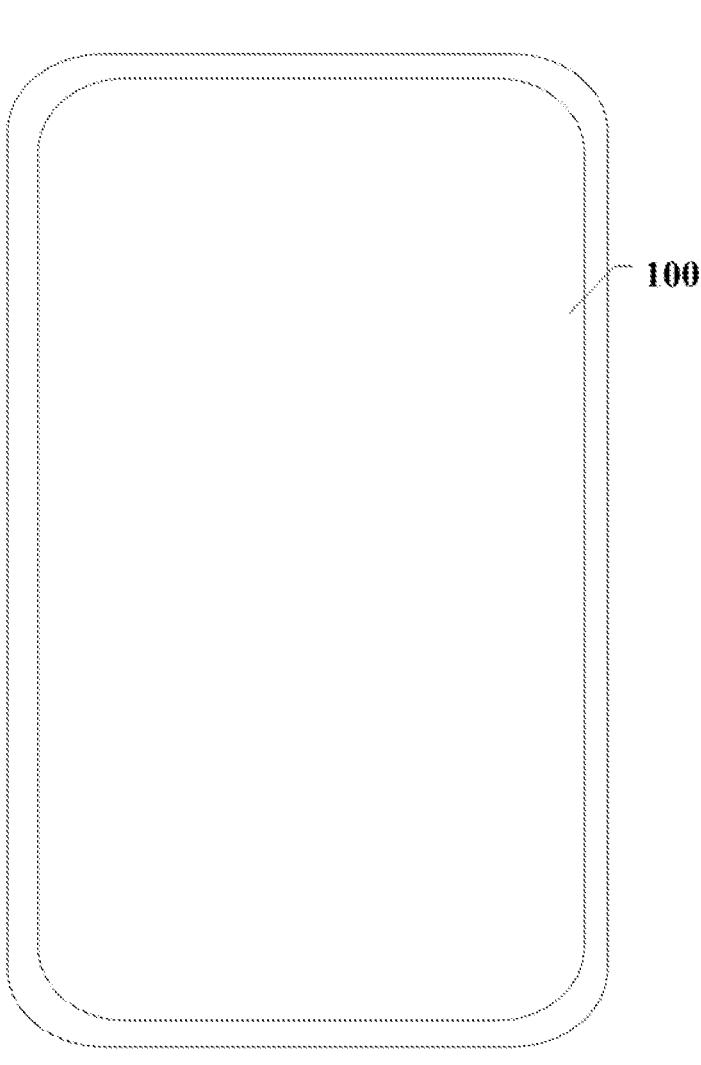
FIG. 18 illustrates an exemplary display device according to various disclosed embodiments of the present disclosure.

The present disclosure also provides a display device. The display device may include a display panel. The display panel may be the display panel provided by the above-mentioned embodiments of the present disclosure or other appropriate display panel. FIG. 18 is a schematic structural diagram of an exemplary display device according to various disclosed embodiments of the present disclosure. As shown FIG. 18, the display device 200 may include the display panel 100 provided by any of the above-mentioned embodiments of the present disclosure.

It can be understood that the display device provided in the embodiment of the present disclosure may be a computer, a mobile phone, a tablet, or other display devices with a display function, which is not specifically limited in the present disclosure. The display device provided by the embodiment of the present disclosure may have the beneficial effect of the display panel provided by the embodiment of the present disclosure. For details, reference may be made to the specific descriptions of the display panel in the above embodiments, and details will not be repeated here in this embodiment.

It may be known from the above embodiments that the display panel and the display device provided by the present disclosure may at least achieve the following beneficial effects.

In the display panel and the display device provided by the present disclosure, along the first direction, the first display area in the display area may be located on at least one side of the second display area, the display panel may include a connection wiring connected to the first data line, at least a portion of the line segments of the connection wiring may be located in the second display area, and the first data line may be connected to the first fan-out line through the connection line. In such a configuration, it may be beneficial to realize the narrow frame design of the product. The display panel may also include a power signal line, and some line segments of the power signal lines may be located in the first fan-out area. In the direction perpendicular to the plane where the display panel is located, the first fan-out line may overlap with the power signal line, and the line segments overlapping the power signal line among the first fan-out lines may be located on the same layer. In this way, in the first fan-out area, in the direction perpendicular to the plane where the display panel is located, the vertical distances between the different first fan-out lines and the power signal lines may be same, which may be beneficial to reduce the difference in coupling capacitance between the different first fan-out lines and the power signal lines. Accordingly, it may be conducive to reducing the difference in coupling capacitance between the data lines connected to different first fan-out lines; and may be beneficial to reduce the uneven display caused by the above-mentioned difference in coupling capacitance.

Although some specific embodiments of the present disclosure have been described in detail through examples, those skilled in the art should understand that the above examples are for illustration only and not intended to limit the scope of the present disclosure. Those skilled in the art will appreciate that modifications can be made to the above embodiments without departing from the scope and spirit of the disclosure. The scope of the disclosure is defined by the appended claims.

What is claimed is:

1. A display panel, comprising:
   a display area including a first display area and a second display area, wherein the first display area is located at at least one side of the second display area in a first direction;
   a first fan-out area located at one side of the display area in a second direction, wherein the first fan-out area includes a plurality of fan-out lines, and the plurality of fan-out lines include a plurality of first fan-out lines and a plurality of second fan-out lines, and the first direction intersects the second direction;
   a plurality of data lines extending in the second direction and arranged in the first direction, wherein the plurality of data lines include a plurality of first data lines located in the first display area and a plurality of second data lines located in the second display area;
   a plurality of connection wirings, wherein at least a portion of line segments of the plurality of connection wirings are located in the second display area, a first data line of the plurality of first data lines is connected to a first fan-out line of the plurality of first fan-out lines through a connection wiring of the plurality of connection wirings, and a second data line of the plurality of second data lines is connected to a second fan-out line of the plurality of second fan-out lines; and
   a power signal line, wherein at least a portion of line segments of the power signal line is located in the first fan-out area, along a direction perpendicular to a substrate of the display panel, the first fan-out line overlaps with the power signal line, and a line segment overlapping with the power signal line in each of the plurality of first fan-out lines is located on a same layer and located at a same vertical distance from the power signal line.

2. The display panel according to claim 1, wherein:
   in the first fan-out area, the plurality of fan-out lines are symmetrically arranged, and an axis of symmetry extends in the first direction and is located in a middle of the first fan-out area.

3. The display panel according to claim 1, wherein:

in a direction from the first display area to the second display area, lengths of connection wirings corresponding to different first data lines decrease gradually, and a line width of a connection wiring with a larger length is greater than a line width of a connection wiring with a smaller length.

4. The display panel according to claim 1, wherein:

in a direction perpendicular to the substrate of the display panel, a vertical distance between the first fan-out line overlapping with the power signal line and the power signal line is D1, a vertical distance between the second fan-out line overlapping with the power signal line and the power signal line is D2, and D1>D2.

5. The display panel according to claim 1, comprising:

the substrate and a first metal layer, a capacitor metal layer, a second metal layer and a third metal layer arranged on a same side of the substrate, wherein:

the first metal layer is located between the substrate and the capacitor metal layer, the second metal layer is located between the capacitor metal layer and the third metal layer, and the third metal layer is located on a side of the second metal layer away from the substrate; and the power signal line is located on at least one of the second metal layer and the third metal layer, the first fan-out line is located on the first metal layer, and the second fan-out line is located on the capacitor metal layer.

6. The display panel according to claim 1, comprising:

the substrate and a first metal layer, a capacitor metal layer, a gate metal layer, a second metal layer and a third metal layer arranged on a same side of the substrate, wherein:

the first metal layer is located between the substrate and the capacitor metal layers, the gate metal layer is located on a side of the capacitor metal layer away from the substrate, the second metal layer is located on a side of the gate metal layer away from the substrate, and the third metal layer is located on a side of the second metal layer away from the substrate;

the power signal line is located on at least one of the second metal layer and the third metal layer; and the first fan-out line is located on the first metal layer, and the second fan-out line is located on the capacitor metal layer or the gate metal layer; or, the first fan-out line is located on the capacitor metal layer, and the second fan-out line is located on the gate metal layer.

7. The display panel according to claim 1, wherein:

the connection wirings include a plurality of first connection wirings extending in the first direction and a plurality of second connection wirings extending in the second direction;

the plurality of first connection wirings and the plurality of second connection wirings are electrically connected;

the display panel further includes a first signal line extending in the first direction; and in a direction perpendicular to the substrate of the display panel, a first connection wiring of the plurality of first connection wirings does not overlap with the first signal line.

8. The display panel according to claim 7, comprising:

a plurality of pixel circuits, at least electrically connected to the plurality of data lines, scan lines, light-emitting control signal lines and reset signal lines, wherein the first signal line includes at least one of the scan lines, the light-emitting control signal lines and the reset signal lines.

9. The display panel according to claim 7, wherein:

in a direction perpendicular to the substrate of the display panel, the second connection wiring does not overlap with a data line of the plurality of data lines.

10. The display panel according to claim 1, comprising:

a plurality of pixel circuits; and a first shielding layer, wherein:

a pixel circuit of the plurality of pixel circuits includes a driving transistor, and a gate of the driving transistor is connected to a first node;

the first shielding layer is located at a side of the first node facing a light-exiting surface of the display panel and overlaps the first node;

the first shielding layer receives a constant potential signal; and the first shielding layer is on a same layer as a portion of line segments of the connection wirings, or the first shielding layer is located between the portion of the line segments of the connection wirings and the first node.

11. The display panel according to claim 10, wherein at least a portion of the line segments of the power signal line is multiplexed as the first shielding layer.

12. The display panel according to claim 1, comprising:

a plurality of pixel circuits; and a second shielding layer, wherein:

a pixel circuit of the plurality of pixel circuits include a driving transistor and a compensation transistor;

a gate of the driving transistor is connected to a first node, and the compensation transistor is connected between the first node and an output terminal of the driving transistor;

the second shielding layer is located at at side of an active layer of the compensation transistor facing a light-exiting surface of the display panel and overlaps the active layer;

the second shielding layer receives a constant potential signal;

the second shielding layer is on a same layer as a portion of a line segment of the connection wiring, or the second shielding layer is located between the portion of the line segment of the connection wiring and the active layer of the compensation transistor.

13. A display panel, comprising:

a display area including a first display area and a second display area, wherein the first display area is located at at least one side of the second display area in a first direction;

a first fan-out area, a second fan-out area, and a bending area located at one side of the display area in a second direction, wherein the first fan-out area includes a plurality of fan-out lines, and the plurality of fan-out lines include a plurality of first fan-out lines and a plurality of second fan-out lines, and the first direction intersects the second direction;

a plurality of data lines extending in the second direction and arranged in the first direction, wherein the plurality of data lines include a plurality of first data lines located in the first display area and a plurality of second data lines located in the second display area;

a plurality of connection wirings, wherein at least a portion of line segments of the plurality of connection wirings are located in the second display area, a first data line of the plurality of first data lines is connected to a first fan-out line of the plurality of first fan-out lines through a connection wiring of the plurality of connection wirings, and a second data line of the plurality of second data lines is connected to a second fan-out line of the plurality of second fan-out lines; and a power signal line, wherein at least a portion of line segments of the power signal line is located in the first fan-out area, along a direction perpendicular to a substrate of the display panel, the first fan-out line overlaps with the power signal line, and a line segment overlapping with the power signal line in each of the plurality of first fan-out lines is located on a same layer, wherein:

the second fan-out area is located at a side of the first fan-out area away from the display area;

the bending area is located between the first fan-out area and the second fan-out area;

the second fan-out area includes a plurality of third fan-out lines and a plurality of fourth fan-out lines, and a third fan-out line of the plurality of third fan-out lines is connected to the first fan-out line and a fourth fan-out line of the plurality of fourth fan-out lines is connected to the second fan-out line; and the plurality of third fan-out lines are disposed on a same layer.

14. The display panel according to claim 13, wherein: the first fan-out line and the second fan-out line are disposed on a same layer.

15. The display panel according to claim 13, wherein: at least a portion of the line segments of the power signal line are located in the second fan-out area;

in the second fan-out area, in a direction perpendicular to the substrate of the display panel, the third fan-out line overlaps with the power signal line;

among the first fan-out line and the third fan-out line electrically connected to a same first data line, an overlapping area of the first fan-out line and the power signal line is smaller than an overlapping area of the third fan-out line and the power signal line; and in the direction perpendicular to the substrate of the display panel, a distance between the first fan-out line and the power signal line is smaller than a distance between the third fan-out line and the power signal line.

16. The display panel according to claim 13, wherein: first fan-out lines and second fan-out lines adjacent to the first fan-out lines are alternately arranged in different layers; and third fan-out lines and fourth fan-out lines adjacent to the third fan-out lines are alternately arranged in different layers.

17. The display panel according to claim 13, wherein: multiple second fan-out lines that are not adjacent to the first fan-out lines are distributed in at least two different layers and arranged alternately; and multiple fourth fan-out lines that are not adjacent to the third fan-out lines are distributed in at least two different layers and arranged alternately.

18. The display panel according to claim 13, wherein: in the second fan-out area, a line width of the third fan-out line is greater than a line width of the fourth fan-out line.

19. The display panel according to claim 13, wherein: in the first direction, an n-th fan-out line in the first fan-out area is electrically connected to the n-th fan-out line in the second fan-out area.

20. A display device, comprising:

a display panel, wherein the display panel includes:

a display area including a first display area and a second display area, wherein the first display area is located at at least one side of the second display area in a first direction;

a first fan-out area located at one side of the display area in a second direction, wherein the first fan-out area includes a plurality of fan-out lines, and the plurality of fan-out lines include a plurality of first fan-out lines and a plurality of second fan-out lines, and the first direction intersects the second direction;

a plurality of data lines extending in the second direction and arranged in the first direction, wherein the plurality of data lines include a plurality of first data lines located in the first display area and a plurality of second data lines located in the second display area;

a plurality of connection wirings, wherein at least a portion of line segments of the plurality of connection wirings are located in the second display area, a first data line of the plurality of first data lines is connected to a first fan-out line of the plurality of first fan-out lines through a connection wiring of the plurality of connection wirings, and a second data line of the plurality of second data lines is connected to a second fan-out line of the plurality of second fan-out lines; and a power signal line, wherein at least a portion of line segments of the power signal line is located in the first fan-out area, along a direction perpendicular to a substrate of the display panel, the first fan-out line overlaps with the power signal line, and a line segment overlapping with the power signal line in each of the plurality of first fan-out lines is located on a same layer and located at a same vertical distance from the power signal line.

* * * * *